United States Patent [19]

Ferland et al.

[11] Patent Number: 4,659,997
[45] Date of Patent: Apr. 21, 1987

[54] DIFFERENTIAL VOLTAGE MEASURING CIRCUIT

[75] Inventors: Michael R. Ferland, Nashua, N.H.; Roger V. Burns, Jr., Plymouth; J. Anson Whealler, Jr., Cohasset, both of Mass.

[73] Assignee: Teradyne, Inc., Boston, Mass.

[21] Appl. No.: 787,755

[22] Filed: Oct. 15, 1985

[51] Int. Cl.[4] .............................................. H03F 3/45
[52] U.S. Cl. ................................... 330/257; 330/258; 330/260; 324/123 R; 324/123 C
[58] Field of Search ................ 330/69, 253, 257, 258, 330/260; 324/123 R, 123 C

[56] References Cited

U.S. PATENT DOCUMENTS

| | | | |
|---|---|---|---|
| 3,530,395 | 9/1970 | Prusha | 330/260 X |
| 3,984,780 | 10/1976 | Hsiao et al. | 330/260 X |
| 4,152,659 | 5/1979 | Gordon | 330/9 |
| 4,191,929 | 3/1980 | Max et al. | 330/10 |
| 4,490,682 | 12/1984 | Poulo | 330/9 |
| 4,551,687 | 11/1985 | Lukens | 330/258 |

OTHER PUBLICATIONS

Baert et al., "Precision Voltage to Single-Ended Current Source Sidesteps CMRR Problems", Electronic Design, Jun. 14, 1984, p. 320.
Wurcer, "A Programmable Instrumentation Amplifier for 12-Bit Resolution Systems", IEEE Journal of Solid-State Circuits, vol. SC-17, No. 6, Dec., 1982, pp. 1102-1111.
Williams, "Monolithic CMOS-Switch IC Suits Diverse Applications", EDN, Oct., 1984, pp. 183-194.
Sevastopoulous, "Charge-Nulled CMOS Switch Lets op Amps Tackle Precision Analog Tasks", Electronic Design, Oct. 4, 1984, pp. 195-202.
Skolnik, "Design Considerations for Linear Optically Coupled Isolation Amplifiers", IEEE J. of Solid-State Circuits, vol. SC-17, No. 6, Dec. 1982, pp. 1094-1101.
Haslett et al., "A Precision Controlled Current Source", IEEE Transactions on Instrumentation and Measurement, vol. IM-29, No. 3, Sep. 1980, pp. 212-213.

Primary Examiner—James B. Mullins

[57] ABSTRACT

Apparatus for measuring the difference between two voltages in which a first current proportional to the voltage difference is generated at a first point, and there is circuitry for delivering at a second point a second current that is based on the first current and is indicative of the voltage difference; the circuitry includes an uninterrupted current path from the first point to the second point and the current path has a circuit element across which at least a portion of the common mode voltage appears; and the circuit element provides an output current to the path which is independent of the voltage across the circuit element.

10 Claims, 1 Drawing Figure

DIFFERENTIAL VOLTAGE MEASURING CIRCUIT

BACKGROUND OF THE INVENTION

This invention relates to measuring electrical currents.

A current is typically measured by passing it through a known resistance and measuring the resulting voltage difference between the two ends of the resistance. The ability of the measuring circuit to accurately respond to the differential voltage while ignoring the common mode voltage (the average of the voltages at the two points, which may be many times larger than the differential voltage) is called the common mode rejection.

A typical measuring circuit receives as inputs the voltages at the two measuring points and delivers as its output a single voltage (referenced to a ground) that is an amplified version of the differential voltage with the common mode voltage component eliminated.

In instrumentation amplifier type measuring circuits, each of the input voltages is amplified separately and the amplified versions are then subtracted from one another both to eliminate the common mode voltage and to derive an amplified version of the differential voltage.

Isolation amplifier type measuring circuits have an inductive, optical, or capacitive barrier. Only the differential voltage can cross the barrier and appear at the output. The common mode voltage appears between the lower one of the input voltage and the ground reference of the output voltage. The differential voltage is passed across the barrier by causing a voltage or current on the output side of the barrier to track exactly a voltage or current on the input side which is arranged to be representative of the differential voltage of interest.

SUMMARY OF THE INVENTION

A general feature of the invention is apparatus for measuring the difference between two voltages in which a first current proportional to the voltage difference is generated at a first point, and there is circuitry for delivering at a second point a second current that is based on the first current and is indicative of the voltage difference; the circuitry includes an uninterrupted current path from the first point to the second point and the current path has a circuit element across which at least a portion of the common mode voltage appears; and the circuit element delivers an output current on the path which is independent of the voltage across the circuit element.

Preferred embodiments of the invention include the following features. The first current is generated using an operational amplifier in a feedback mode and the operational amplifier is powered in a zero common mode configuration relative to one of the two voltages. The circuit element is a high voltage MOSFET transistor with its source and drain connected respectively to the first and second points to produce an offset current at the first point and a lead of the current element is also connected to the first point. The current source includes a second circuit element that is connected at the first point and has an output current independent of the voltage across the second circuit element, and wherein at least a portion of the common mode voltage is caused to appear across the second element. A current mirror is connected to the second point to provide at a third point a current identical to the second current. There are two current sources that produce two offset currents respectively at said first and third points in the apparatus, an output lead being connected to the third point to carry an output current equal to the first current. The two offset currents can be trimmed to cause the output current to be zero when the difference between the two voltages is zero. The operational amplifiers draw negligible current, as does the circuit element. The first current is generated by an operational amplifier with one input connected to receive one of the voltages. A resistor is connected between the other voltage and a second input of the operational amplifier, and the MOSFET transistor has its source connected to the second input, its drain connected to the second point, and its gate connected to an output of the operational amplifier.

A high common mode rejection ratio is achieved. The circuit is relatively insensitive to temperature shifting or time shifting component values. The input voltages can have a relatively high value, e.g., 60 volts or higher. Each input voltage can have either polarity. Any offset in the output current can be trimmed away.

Other features and advantages will become apparent from the following description of the preferred embodiment, and from the claims.

DESCRIPTION OF THE PREFERRED EMBODIMENT

Figure 1:
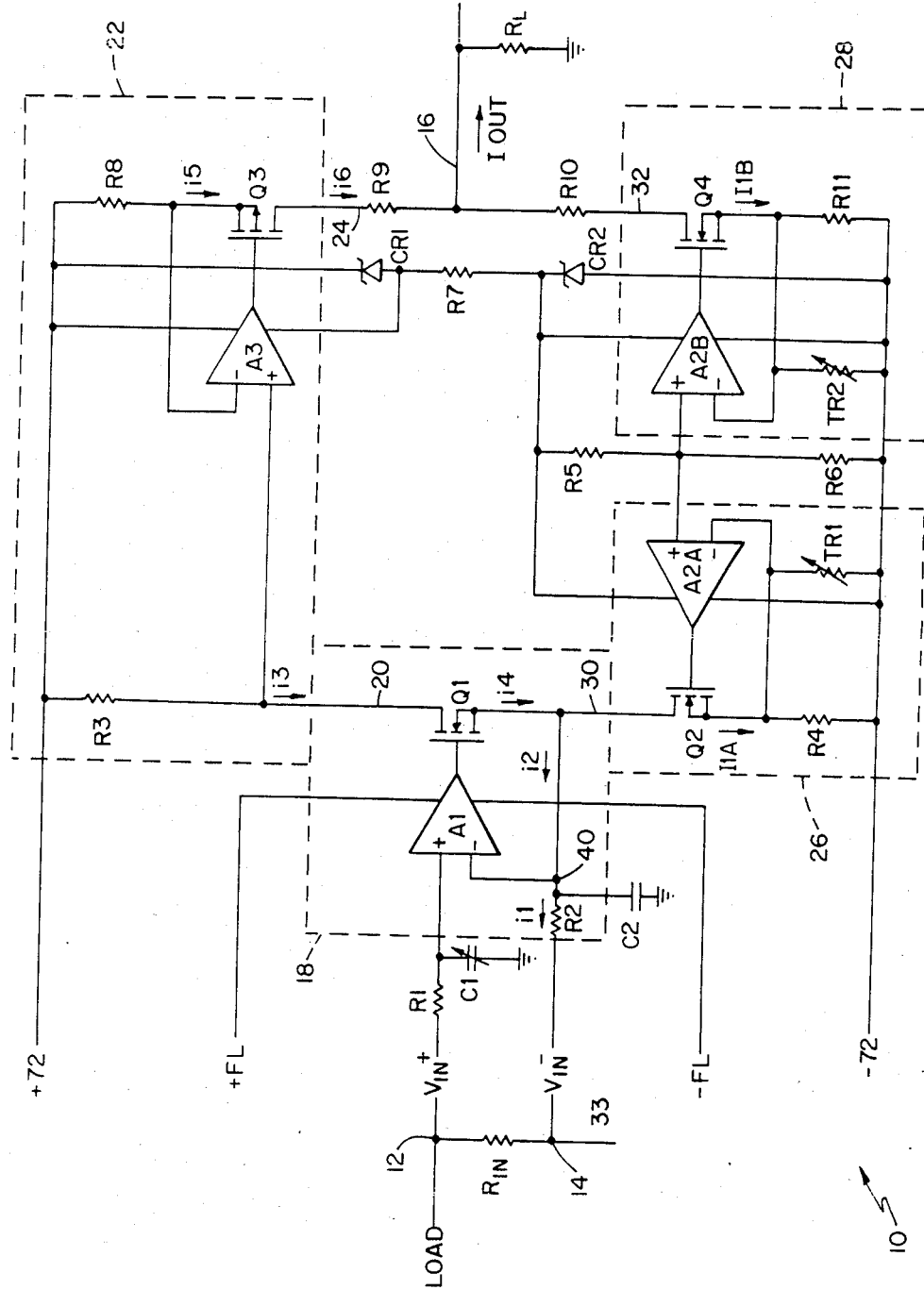
FIG. 1 is a differential voltage measurement circuit.

Referring to FIG. 1, circuit 10 receives at points 12, 14 two input voltages ($V_{in}+$, $V_{in}-$) and delivers at an output 16 a current ($I_{out}$) whose value represents the magnitude of the difference between the two input voltages. Each of the input voltages $V_{in}+$, $V_{in}-$ may be of either polarity and $V_{in}+$ may be either larger or smaller than $V_{in}-$. Circuit 10 includes a voltage-to-current converter 18 which is connected to point 14, to point 12 via a resistor R1, and (via an output lead 20) to a current mirror 22. The output lead 24 of mirror 22 is connected via resistor R9 to output 16. Circuit 10 also includes two identical current sources 26, 28 which are connected respectively via leads 30, 32 to converter 18 and mirror 22.

In converter 18, an operational amplifier A1 has its + (non-inverting) and − (inverting) inputs connected respectively via resistors R1 and R2 to points 12, 14. The + input of amplifier A1 is also connected to ground via a variable capacitor C1 and the − input is also connected to ground via a capacitor C2. The output of amplifier A1 is connected to the gate of a high-voltage MOSFET transistor Q1. The source of transistor Q1 is connected by a feedback path to the − input of amplifier A1 and is also connected via lead 30 to current source 26.

In mirror 22, an operational amplifier A3 has its + input connected via lead 20 to the drain of transistor Q1, and via a resistor R3 to a +72 volts supply. The − (inverting) input of amplifier A3 is connected via a resistor R8 (which has the same resistance as R3) to the +72 volts supply, and is also connected (by a feedback path) to the source of a high-voltage MOSFET transistor Q3. The source of transistor Q3 is connected via a resistor R9 to output 16. The output of amplifier A3 is connected to the gate of transistor Q3.

In current sources 26, 28, MOSFET transistors Q2, Q4 have their gates fed by operational amplifiers A2A, A2B, and have their drains connected to leads 30, 32, and their sources connected via resistors R4, R11 to −72 volts, and via feedback back paths to the − (inverting) inputs of amplifiers A2A, A2B. The feedback paths are also connected via trimming resistors TR1, TR2 to −72 volts.

Amplifiers A2A, A2B, and A3 are powered by means of two Zener diodes CR1, CR2, and a resistor R7 connected in series between the +72 volts and the −72 volts. Zener diode CR2 powers amplifiers A2A and A2B, and by means of a voltage divider R5, R6 biases the + inputs of the two amplifiers. Zener diode CR1 powers amplifier A3. The Zener diode arrangement is required because amplifiers A2A, A2B, and A3 must operate on signals close to the +72 and −72 supply voltages.

Amplifier A1 is powered by floating voltages +FL and −FL. Voltages +FL and −FL are provided by circuitry (not shown) which causes them to have values which are respectively about 12 volts above and below the voltage 33 (e.g., in the range of +60 volts to −60 volts) that is delivered via a precision input resistor $R_{in}$ to a load. The current to or from the load is the current of interest and $R_{in}$ converts that current into voltages at points 12, 14, that have a voltage differential of less than 1 volt. Amplifier A1 considers 0 volts common mode to be at the midpoint between its supply voltages, which is equal to voltage 33 and approximately the same as the common mode of the voltages $V_{in}+$ and $V_{in}-$. Thus changes in the common mode of $V_{in}+$ and $V_{in}-$ are effectively not seen by amplifier A1 and amplifier A1 is operated at very nearly a zero common mode voltage, thus reducing any adverse effect of large common mode input voltages or large swings in common mode input voltages.

The components in converter 18 and mirror 22 are chosen for precision performance. Operational amplifiers A1 and A3 have FET inputs which draw negligibly small bias currents in this application. The gate currents of the transistors Q1, Q3 are negligibly small so that their respective source currents are closely repeated in their drain currents.

Current sources 26, 28 generate currents I1A, I1B at the drains of transistors Q2, Q4; these two current sources allow circuit operation with bipolar voltages $V_{in}+$, $V_{in}-$. The nominal values of currents I1A, I1B are determined by voltage divider R5, R6. Trimmers TR1 and TR2 are included so that the values of I1A and I1B can be trimmed so as to zero the output current ($I_{out}$) whenever the differential between $V_{in}+$ and $V_{in}-$ is zero. Matching of the values of I1A and I1B does not affect the common mode rejection ratio of the circuit. Amplifiers A2A, A2B are two halves of a dual monolithic integrated circuit which provides reasonably good matching of their characteristics with changing temperature.

The circuit components have the following values and identifying numbers:

R1—27K ohms, 5%
R2—2K ohms, 0.01%
R3, R8, R4, R11—4K ohms, 0.01%
R5—31.6K ohms, 1%
R6—10K ohms, 1%
R7—two 68K ohm, 5% ¼ watt resistors in parallel
R9, R10—20K ohms, 1%
C1—2.5-10 pF variable in series with 10 pF fixed
C2—100 pF
Q1, Q2, Q4—VN0530N3 n-channel MOSFET (Supertex, Inc.)
Q3—VP0530N3 p-channel MOSFET (Supertex, Inc.)
A1, A3—LF441A
A2A, A2B—LM358A (dual amplifier)
CR1, CR2—1N968B, 20-volt Zener diode Operation The feedback around A1 forces its − input to the same voltage as its + input and as a result the voltage differential $[(V_{in}+)-(V_{in}-)]$ across resistor R2 is converted to a current proportional to the voltage differential:

$$i_1 = \frac{(V_{IN+}) - (V_{IN-})}{R2}$$

Because the input of A1 draws negligible current $i_2 = i_1$ at a first point 40. Also $i_4 = i_2 + I1A$, and because transistor Q1 draws negligible gate current, $i_3 = i_4 = i_1 + I1A$. Because negligible current is drawn by the + input of amplifier A3, all of $i_3$ flows through R3 causing a voltage drop of $i_3R3$. Feedback around A3 causes the voltage at the lower end of R8 to equal the voltage at the lower end of R3. Since R3 = R8, the equal voltage drops cause equal currents to flow in R3 and R8, i.e., $i_5 = i_3$ that is $i_5$ mirrors $i_3$ and $i_5 = i_3 = i_1 + I1A$. Because the gate current of transistor Q3 is negligibly small, $i_6 = i_5 = i_1 + I1A$. The output current, $I_{out} = i_6 - I1B = i_1 + I1A - I1B$. Since I1A is adjusted to be equal to I1B, $$I_{OUT} = i_1 = \frac{[(V_{IN+}) - (V_{IN-})]}{R2}$$

as desired. The true effect of the negligible amplifier input and transistor gate currents is only to cause a small offset in $I_{out}$ which can be eliminated by adjusting TR1 or TR2. R1, R2, C2 minimize the circuit's response to AC common mode signals. The two R−C networks R1−C1, R2−C2 are used to balance (by adjusting C1) the time delays of the AC common mode signals to reach the two inputs of amplifier A1, thus preventing the AC common mode signals from producing a spurious voltage differential across R2.

The DC common mode rejection ratio of the circuit is approximately 125 to 140 dB, which is achieved without circuit adjustments or trims or any kind.

As a specific example of certain voltage relationships, if $V_{in}+ = 60$ volts, and $V_{in}- = 59$ volts, then one volt appears across R2, and $i_1 = \frac{1}{2}$ milliamp. The bias voltage at the + input of amplifer A2A is set to cause I1A = 1.18 milliamps. Thus $i_4 = 0.5 + 1.18 = 1.68$ milliamps and $i_3 = 1.68$ milliamps and the voltage across R3 is 6.72 volts. Likewise the voltage drop across R4 is 4.72 volts. Since the source of Q1 is at 60 volts, the drop across Q1 is 5.28 volts and across Q2 is 127.28. Thus, most of the common mode voltage appears across a high impedance current source so that the size of the common mode voltage and swings in the common mode voltage do not affect the current being measured. Depending on the relative values of $V_{in}+$ and $V_{in}-$ and their polarities, most of the common mode voltage may appear across Q1, also a high-impedance device whose drain current is not affected by common mode voltage swings. Thus $i_3$ is representative of $i_1$ regardless of the magnitude or changes in magnitude of the common mode voltages dropped across Q1 or Q2.

Other embodiments are within the following claims.

The relatively low impedance input $V_{in}-$ (equal to R2, 2000 ohms) can be converted to a high input impedance by driving the input $V_{in}-$ from an operational amplifier voltage follower of standard design. The input to the follower would be the new high-impedance inverting input for the overall circuit. In that case the follower amplifier must be powered from the floating supplies $\pm FL$, to preserve the high common mode rejection ratio.

By placing a 1000 ohm resistor in series with the gate leads of the transistors, trouble shooting becomes easier because the non-zero voltage across one of the resistors would indicate gate current flowing into a bad transistor. In normal operation, the resistors have no effect since the gate currents are negligible.

The common mode input voltages for which the circuit is useful can be increased from about 60 volts (the limiting factor being the breakdown voltage of the transistors) by increasing the fixed supplies from $\pm 72$ to nearly $\pm 200$ volts, scaling the resistor values to control dissipation, and using capacitors of adequate breakdown voltage. The fixed supplies could also be reduced below $\pm 72$ volts.

The extremely high output impedance would permit $I_{out}$ to be accurately converted to a voltage by connection to ground through a resistor ($R_L$) for a gain of $R_L/R_2$, or by use of a standard operational amplifier current-to-voltage converter circuit.

When amplifier A1 is an LF441A, improved dynamic performance can be attained by connecting its pin 1 to its pin 5.

We claim:

1. Apparatus for measuring for difference between two voltages and rejecting common mode signals comprising
   means for generating at a first point in said apparatus a first current proportional to said difference at a voltage related to the common mode voltage of said two voltages,
   a circuit path between a high voltage source and a low voltage source,
     said path including a node that is connected to said first point and between said high voltage source and said low voltage source,
     said two voltages being between the voltages of said high and low voltage sources,
   a circuit element along said circuit path between said node and one of said high and low voltage sources,
     said circuit element being connected to said means so as to produce a second current through it that is indicative of said voltage difference and is independent of the voltage across it,
     said second current also flowing through a second point on said cirucit path between said node and said one voltage source,
     a portion of said common mode voltage appearing across said circuit element,
   a first offset current source along said circuit path between said node and the other of said high and low voltage sources,
     said offset current source providing an offset current from said node, permitting said first current to be of either polarity, and
   a current mirror connected to said second point for providing at a third point in said apparatus a current identical to said second current, whereby the magnitude of said second current can be determined without affecting its value by sensing said third current.

2. The apparatus of claim 1 wherein said means for generating said first current comprises an operational amplifier connected in a feedback mode, and said operational amplifier is powered in a zero common mode configuration relative to one of said two voltages via floating voltage sources.

3. The apparatus of claim 2 wherein said operational amplifier has inputs which draw negligible current.

4. The apparatus of claim 1 wherein said circuit element comprises a transistor connected between said first and second points.

5. The apparatus of claim 4 wherein said transistor comprises a high voltage MOSFET transistor with its source and drain respectively connected to said first and second points.

6. The apparatus of claim 1 wherein said first offset current source comprises a second circuit element connected to said node and having an output current independent of the voltage across said second circuit element, and wherein at least a portion of said common mode voltage is caused to appear across said second element.

7. The apparatus of claim 1 further comprising a second offset current source for producing a second offset current identical to said first offset current at said in said apparatus, and an output lead connected to said third point to carry an output current equal to said first current.

8. The apparatus of claim 7 wherein said first and second offset current sources include means for trimming said offset currents to cause said output current to be zero when said difference between said two voltages is zero.

9. The apparatus of claim 1 wherein said circuit element draws negligible current for its operation.

10. The apparatus of claim 1 wherein said generating means comprises
   an operational amplifier having inverting and noninverting inputs, said noninverting input being connected to receive one said voltage,
   a resistor connected between the other said voltage and the inverting input of said operational amplifier,
   and wherein said circuit element comprises a MOSFET transistor whose source is connected to said inverting input, drain is connected to said second point, and gate is connected to an output of said operational amplifier.

* * * * *